(12) United States Patent
Natsuhara et al.

(10) Patent No.: US 6,294,275 B1
(45) Date of Patent: Sep. 25, 2001

(54) ALUMINUM-NITRIDE SINTERED BODY, METHOD FOR FABRICATING THE SAME, AND SEMICONDUCTOR SUBSTRATE COMPRISING THE SAME

(75) Inventors: Masuhiro Natsuhara; Hirohiko Nakata; Yasuhisa Yushio; Motoyuki Tanaka; Shunji Nagao; Akira Shinkoda; Kazutaka Sasaki, all of Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/304,531

(22) Filed: May 4, 1999

(30) Foreign Application Priority Data

May 6, 1998 (JP) .................................. 10/123022

(51) Int. Cl.$^7$ ........................................ B32B 9/00
(52) U.S. Cl. ................... 428/698; 428/209; 501/98.4; 423/412; 264/603
(58) Field of Search .................. 428/209, 457, 428/698; 501/98.4; 423/412; 264/618, 603

(56) References Cited

U.S. PATENT DOCUMENTS 5,876,682 * 3/1999 Kurihara et al. .
6,072,240 * 6/2000 Kimura et al. .

FOREIGN PATENT DOCUMENTS

| 0 598 399 | 5/1994 | (EP) . |
| 0 626 359 | 5/1994 | (EP) . |
| 61-201608 * | 6/1986 | (JP) . |
| 6-206772 | 7/1994 | (JP) . |
| 6-329474 | 11/1994 | (JP) . |
| 7-172921 | 7/1995 | (JP) . |
| 10-81569 | 3/1998 | (JP) . |

OTHER PUBLICATIONS

Kim et al., "Ultrafine Aluminum Nitride Powder Produced by Plasma–Assisted Chemical Vapor Deposition of Trimethylaluminum", J. Mat. Sci., 27, 2580–88 (1992).*

"Aluminum Nitride ceramics with High Thermal Conductivity from Gas–Phase Synthesized Powders," Greil, et al. Journal of the European Ceramic Society, vol. 13, No. 3, pp. 229–237, 1994. (No Month).

* cited by examiner

Primary Examiner—Deborah Jones
Assistant Examiner—Wendy Boss
(74) Attorney, Agent, or Firm—McDermott, Will & Emery

(57) ABSTRACT

An aluminum-nitride sintered body that has both high thermal conductivity and high mechanical strength, a fabricating method for the same, and a semiconductor substrate comprising the same. A material powder is prepared by mixing an aluminum-nitride powder, constituting 1 to 95 wt. %, having an average particle diameter of 1.0 $\mu$m or less obtained by chemical vapor deposition, with another type or types of aluminum-nitride powders constituting the remaining part. The material powder is sintered in a non-oxidizing atmosphere to obtain a sintered body having an average grain diameter of 2 $\mu$m or less and a half width of the diffraction peak on the (302) plane, obtained by X-ray diffraction, of 0.24 deg. or less. Formation of a metallized layer on the sintered body yields a semiconductor substrate.

6 Claims, No Drawings

ALUMINUM-NITRIDE SINTERED BODY, METHOD FOR FABRICATING THE SAME, AND SEMICONDUCTOR SUBSTRATE COMPRISING THE SAME

BACKGROUND OF THE INVENTION

1. Field of the Invention

The invention relates to an aluminum-nitride sintered body mainly used in semiconductor substrates, particularly an aluminum-nitride sintered body that has both high thermal conductivity and considerably improved mechanical strength, a fabricating method for the same, and a semiconductor substrate comprising the same.

2. Description of the Background Art

Having high thermal conductivity, superior electrical insulating properties, and a coefficient of thermal expansion close to that of silicon, aluminum-nitride sintered bodies have been used for heat-dissipating substrates for semiconductors. This has expedited studies on the enhancement of thermal conductivity of aluminum nitride aiming at the improvement of heat dissipation, which has enabled the production of sintered bodies having a thermal conductivity of more than 200 W/mK in recent years.

However, such highly heat-conductive aluminum-nitride sintered bodies are composed of sintered grains having an extremely large grain size of 7 to 8 $\mu$m or more, so that their mechanical strength is undesirably low. Means to suppress this reduction in mechanical strength have been studied and disclosed in unexamined published Japanese patent applications Tokukaihei 6-206772, Tokukaihei 6-329474, and Tokukaihei 7-172921.

Tokukaihei 6-206772, for instance, has disclosed a method for fabricating an aluminum-nitride sintered body by mixing an AlN powder having a primary particle size of 0.01 to 0.3 $\mu$m and impurity oxygen of more than 1.5 wt. % with a 7 wt. % or less sintering agent and sintering the resultant mixture at 1600° C. or below in a non-oxidizing atmosphere. According to the patent application, a compound of alkaline-earth metal and/or rare-earth metal, a small number of aluminum compounds, and a small number of silicon compounds are used as the sintering agent; a compound containing transition metal elements may be used as a coloring agent, as required.

The patent application also has disclosed another method wherein an AlN powder having a primary particle size different from the foregoing range, for example 0.5 to 1.0 $\mu$m, is used concurrently. As an example of the embodiment it has presented the production of an aluminum-nitride sintered body with an average grain diameter of 1.5 $\mu$m having a thermal conductivity of 220 W/mK and a 4-point bending strength of 45 kg/mm$^2$ (459 MPa).

Tokukaihei 7-172921 has disclosed a method for fabricating an aluminum-nitride sintered body by mixing a fine AlN powder having an oxygen content of 1.5 wt. % or less and an average particle diameter of 0.5 to 2 $\mu$m with at least one kind of compound of 3A- or 2A-group elements in the periodic table, a small number of Si constituents, a small amount of Al$_2$O$_3$, and oxides of transition metal elements as required and sintering the resultant mixture at 1650 to 1900° C. in a non-oxidizing atmosphere. According to the patent application, the AlN sintered body has a thermal conductivity of 150 W/mK or more, a 3-point bending strength of 490 MPa or more, and a fracture toughness of 2.8 MN/m$^{3/2}$ or more.

As mentioned above, various means have been offered to suppress the reduction in mechanical strength of a highly heat-conductive aluminum-nitride sintered body. However, no means can be said to be suitable for mass production because each individual means requires strict control of a number of manufacturing conditions such as an aluminum-nitride material powder's oxygen content and particle diameter, a sintering agent, and other additives.

As for aluminum-nitride material powders in particular, the oxygen content and the particle diameter differ with manufacturing methods and manufacturers. However, the patent applications cited above do not specify the material powders. Moreover, only a few types of low-cost aluminum-nitride powders obtained by the conventional solid-phase method satisfy the manufacturing conditions of the material powder required in each of the foregoing patent applications.

As for aluminium-nitride, it is known that the properties of the sintered bodies obtained from the material powders having the same average particle diameter are greatly different depending on the lattice defects of the material powders. For example, conventional powders obtained by the solid-phase method are prone to contain lattice strains and other defects in the powder particles due to volume expansion and contraction at the stage of powder synthesis. Because the defects remain in the crystal grains in the sintered body, the defects are liable to act as the starting point of fracture when external stress is applied, reducing the mechanical strength of the sintered body.

SUMMARY OF THE INVENTION

Considering the above-mentioned circumstances, an object of the invention is to offer a highly heat-conductive and mechanically strong aluminum-nitride sintered body producible with the use of virtually every type of aluminum-nitride powder including ordinary low-cost powder as the material powder, a fabricating method for the same, and a semiconductor substrate comprising the same.

In order to achieve the above object, the aluminum-nitride sintered body of the invention specifically has an average grain diameter of 2 $\mu$m or less and a half width of the diffraction peak on the (302) plane, obtained by X-ray diffraction, of 0.24 deg. or less.

The method of the invention for fabricating an aluminum-nitride sintered body is as follows: First, a material powder is prepared by mixing a 1 to 95 wt. % aluminum-nitride powder, having an average particle diameter of 1.0 $\mu$m or less, obtained by chemical vapor deposition, with another type or types of aluminum-nitride powders constituting the remaining part. Second, the material powder is mixed with a sintering-agent powder to produce a formed body. Finally, the formed body is sintered in a non-oxidizing atmosphere.

The foregoing aluminum-nitride sintered body of the invention can be used as a semiconductor substrate by forming a metallized layer on the surface. It is desirable that the metallized layer comprise at least one element selected from the group consisting of W, Mo, Ag, Pd, Pt, Ru, Ti, Au, and Sn. A plated layer may be formed on the metallized layer.

According to the invention, the addition of an aluminum-nitride powder obtained by chemical vapor, deposition into a material powder enables the production of a highly heat-conductive, mechanically strong aluminum-nitride sintered body that allows the formation of a metallized layer. The fabrication method of the invention is notably advantageous, because except for the powder obtained by chemical vapor deposition, practically all types of ordinary low-cost aluminum-nitride powders may be used, and sintering and other manufacturing conditions need not be controlled with strict restrictions.

DETAILED DESCRIPTION OF THE INVENTION

In the invention, an aluminum-nitride material powder comprises a 1 to 95 wt. % aluminum-nitride powder obtained by chemical vapor deposition and a powder or powders of ordinary aluminum-nitride constituting the remaining part. An aluminum-nitride powder obtained by chemical vapor deposition not only is superior in crystallinity and purity but also can be produced as a considerably fine powder in terms of particle diameter; specifically, a powder with an average particle diameter of 1.0 µm or less is easily available.

As mentioned above, the use as a material powder of an aluminum-nitride powder obtained by chemical vapor deposition together with a powder or powders of ordinary aluminum-nitride enables the application of standard manufacturing conditions suitable for mass production to the fabrication of an aluminum-nitride sintered body having enhanced mechanical strength without losing the high thermal conductivity. Although yet to be proved, the high mechanical strength originates from the following mechanism:

An aluminum-nitride powder obtained by chemical vapor deposition is a product of a direct reaction between nitrogen and aluminum in a gas phase and is superior in crystallinity because no treatment such as pulverization is performed. Furthermore, the highly crystalline aluminum-nitride powder easily becomes nuclei for crystal growth during sintering in comparison with ordinary aluminum-nitride powders obtained by direct nitriding, carbothermal reduction, and other solid-phase methods, so that an aluminum-nitride sintered body superior in crystallinity can be obtained.

Consequently, because defects in the grains of the sintered body are decreased, fracture begins at a boundary between grains rather than at a defect in a grain when an external stress is applied to the sintered body. Compared with ordinary sintered bodies that have a relatively large number of defects from which fracture begins in a grain, the sintered body of the invention where fracture begins at a grain boundary has superior mechanical strength. It is considered that the decrease in defects also reduces phonon scattering, increasing the thermal conductivity of the sintered body.

It is desirable that the amount of powder obtained by chemical vapor deposition used in the material powder be 1 to 95 wt. %. If less than 1%, the majority of grains acting as a nucleus of grain growth are represented by powders other than the powder obtained by chemical vapor deposition due to the insufficient amount thereof, relatively reducing the mechanical strength. If more than 95%, formed bodies tend to fracture or to swell at the stage of degreasing because the powder obtained by chemical vapor deposition is quite uniform in particle diameter and not necessarily easy to form.

It is desirable that the average grain diameter of the powder obtained by chemical vapor deposition to be used in the invention be 1.0 µm or less. If more than 1.0 µm, the added powders other than the powder obtained by chemical vapor deposition increase their share in forming nuclei of grain growth, relatively reducing the attainable mechanical strength of the sintered body.

As for the material powders other than an aluminum-nitride powder obtained by chemical vapor deposition, there are no particular limitations. Ordinary aluminum-nitride powders obtainable in the market, such as powders obtained by direct nitriding, carbothermal reduction, and other solid-phase methods, may be used singly or in combination. Since low-cost powders obtained by direct nitriding can be used as part of the material powders, a high-strength aluminum-nitride sintered body can be produced without increasing the manufacturing cost of the sintered body.

Sintering agents to be used in the invention also have no particular limitations. Ordinary sintering agents such as oxides of Y and other 3A-group elements in the periodic table or Ca and other 2A-group elements may be added singly or in combination. Hence, any ordinary forming process such as the press method or doctor-blade method may be employed without special limitations. As for sintering conditions, sintering may be performed under the most suitable temperature according to the sintering agent used.

The aluminum-nitride sintered body obtained by the invention has a half width of the diffraction peak on the (302) plane, obtained by X-ray diffraction, of 0.24 deg. or less. This is because the majority of grains in the sintered body are formed on the nuclei of powder obtained by chemical vapor deposition, producing a sintered body where highly crystalline grains are bonded. If the half width exceeds the foregoing 0.24 deg., the sintered body has a large number of defects in the crystal grains and considerable variation in the diameter of sintered grains, reducing the mechanical strength.

The aluminum-nitride sintered body of the invention is superior in crystallinity of grains and has few crystal defects, so that when external stress is applied to the sintered body, the sintered body fractures at the grain boundaries. As a result, the mechanical strength is heightened without adversely affecting the high thermal conductivity. Some sintered bodies have a 3-point bending strength of 450 MPa or more. According to the invention, the mechanical strength of the sintered body is improved in any grain diameter thereof. However, when the average grain diameter is 2.0 µm or less, the strength is further improved. It is presumed that the smaller grain diameter of the sintered body more effectively distributes the stress applied to the boundaries where fracture begins, relatively increasing the strength of the sintered body.

The highly heat-conductive, mechanically strong aluminum-nitride sintered body of the invention can be used as a semiconductor substrate by forming a metallized layer on the surface thereof as conventional one. It is feasible to form a thick metallized layer comprising at least one element selected from the group consisting of W, Mo, Ag, Pd, Pt, and Ru, for instance, or a thin metallized layer comprising at least one element selected from the group consisting of Ti, Pt, Au, and Sn, for example. An Ni, Au or other plated layer may also be formed on the metallized layer in order to facilitate soldering and increase corrosion resistance.

In general, when a thick metallized layer is formed on an aluminum-nitride sintered body to produce a metallized substrate, the substrate is prone to warp due to the difference in coefficient of thermal expansion between the metallized layer and aluminum-nitride. However, a metallized substrate made with the aluminum-nitride sintered body of the invention has less warpage because of the higher strength thereof as compared with other metallized substrates made with an ordinary sintered body. Moreover, the aluminum-nitride sintered body of the invention has small diameter grains and is superior in mechanical strength, so that when the sintered body is ground before a thin-film circuit is formed, only a small number of aluminum-nitride grains are shed from the sintered body leaving minute holes behind, enabling a highly reliable thin-film circuit pattern.

EXAMPLE 1

An AlN powder obtained by chemical vapor deposition having an average particle diameter of 0.2 μm, an AlN powder obtained by direct nitriding having an average particle diameter of 2.0 μm, and an AlN powder obtained by carbothermal reduction having an average particle diameter of 1.0 μm were prepared. These powders were mixed at a given ratio shown in Table 1. A sintering agent comprising a 2.0 wt. % $Yb_2O_3$ powder, a 1.5 wt. % $Nb_2O_3$ powder, and a 0.2 wt. % CaO powder; an organic solvent; and a binding agent were added to the mixed AlN powders to be mixed by a ball mill for 24 hours. The obtained slurry was converted into the form of a sheet by the doctor blade method to be cut to a given size. The as-cut conditions of the sheets are also shown in Table 1.

TABLE 1

| | Mixing ratio of AlN material powders (wt. %) | | | |
|---|---|---|---|---|
| Sample | Powder by chemical vapor deposition | Powder by direct nitriding | Powder by carbothermal reduction | Condition of sheet |
| 1* | 98 | 2 | 0 | Fractured |
| 2 | 95 | 3 | 2 | Good |
| 3 | 20 | 40 | 40 | Good |
| 4 | 40 | 40 | 20 | Good |
| 5 | 10 | 60 | 30 | Good |
| 6 | 5 | 40 | 55 | Good |
| 7 | 5 | 95 | 0 | Good |
| 8 | 5 | 0 | 95 | Good |
| 9 | 1 | 50 | 49 | Good |
| 10* | 0.5 | 50.5 | 49 | Good |
| 11* | 0 | 50 | 50 | Good |

*Comparative sample

The foregoing individual sheets were degreased at 800° C. in a nitrogen atmosphere, then sintered at 1650° C. for 10 hours in a nitrogen atmosphere. The individual completed AlN sintered bodies were subjected to the following tests and measurements: a 3-point bending strength, an average grain diameter, a half width of the diffraction peak on the (302) plane by X-ray diffraction, and thermal conductivity. The results are shown in Table 2.

TABLE 2

| Sample | Bending strength (MPa) | Average grain diameter (μm) | Half width (deg.) | Thermal conductivity (W/mK) |
|---|---|---|---|---|
| 1* | — | — | — | — |
| 2 | 690 | 1.2 | 0.23 | 175 |
| 3 | 640 | 1.4 | 0.23 | 173 |
| 4 | 650 | 1.4 | 0.23 | 173 |
| 5 | 620 | 1.4 | 0.23 | 172 |
| 6 | 590 | 1.5 | 0.24 | 170 |
| 7 | 570 | 1.7 | 0.24 | 165 |
| 8 | 610 | 1.6 | 0.24 | 170 |
| 9 | 530 | 1.8 | 0.24 | 161 |
| 10* | 440 | 2.2 | 0.25 | 154 |
| 11* | 360 | 3.5 | 0.27 | 131 |

*Comparative sample

As is seen in Tables 1 and 2, a material powder comprising an ordinary AlN powder or ordinary AlN powders and a 1 to 95 wt. % AlN powder obtained by chemical vapor deposition produces an AlN sintered body having a small grain diameter, superior crystallinity, and high 3-point bending strength without adversely affecting the superior thermal conductivity.

EXAMPLE 2

AlN material powders having the same mixing ratio as in sample 6 in Example 1 were mixed with a sintering agent shown in Table 3 below to be sintered via a process similar to Example 1, except that the sintering temperature was varied to give a proper condition according to the sintering agent used. The same properties as those in Example 1 were measured on the completed AlN sintered bodies. The measured results are shown in Table 3 below along with the sintering temperature.

TABLE 3

| Sample | Sintering agent (added amount: wt. %) | Sintering temperature (° C.) | Bending strength (MPa) | Average grain diameter (μm) | Half width (deg.) | Thermal conductivity (W/mK) |
|---|---|---|---|---|---|---|
| 12 | $Y_2O_3$ (0.5) | 1820 | 490 | 1.8 | 0.24 | 185 |
| 13 | $Y_2O_3$ (3.7) | 1820 | 480 | 1.8 | 0.24 | 182 |
| 14 | $Y_2O_3$ (2.0)/CaO (1.7) | 1750 | 530 | 1.6 | 0.24 | 171 |
| 15 | $Y_2O_3$ (0.3)/CaO (0.7) | 1750 | 520 | 1.6 | 0.24 | 173 |
| 16 | CaO (0.5) | 1680 | 540 | 1.5 | 0.24 | 156 |
| 17 | CaO (3.7) | 1680 | 540 | 1.5 | 0.24 | 154 |

As shown in Table 3 above, the AlN sintered body of the invention has sufficient properties when mixed with a sintering agent commonly used for sintering aluminum nitride.

EXAMPLE 3

Material powders and a sintering agent were mixed at the same ratio as that of sample 6 in Example 1 to be sintered via a process similar to Example 1, except that the average particle diameter of the AlN powder obtained by chemical vapor deposition was varied as shown in Table 4 below. The same properties as those in Example 1 were measured on the completed AlN sintered bodies. The measured results are shown in Table 4 below.

TABLE 4

| Sample | Particle diameter of AlN powder ($\mu$m) | Bending strength (MPa) | Average grain diameter ($\mu$m) | Half width (deg.) | Thermal conductivity (W/mK) |
|---|---|---|---|---|---|
| 18 | 0.1 | 670 | 1.5 | 0.23 | 175 |
| 19 | 0.5 | 530 | 1.3 | 0.24 | 169 |
| 20 | 1.0 | 490 | 1.6 | 0.24 | 163 |
| 21* | 1.5 | 440 | 2.5 | 0.26 | 155 |

*Comparative sample

As is seen in Table 4 above, it is desirable that the average particle diameter of the AlN powder obtained by chemical vapor deposition and added in the material powder be 1.0 $\mu$m or less.

COMPARATIVE EXAMPLE

In accordance with the method disclosed in the above-cited unexamined published Japanese patent application Tokukaihei 6-206772, an AlN powder obtained by carbothermal reduction having an average particle diameter of 0.2 $\mu$m and an impurity oxygen content of 2.3 wt. %, a sintering agent comprising a 5.0 wt. % $YF_3$ powder having an average particle diameter of 0.2 $\mu$m, an organic solvent, and a binding agent were mixed by a ball mill for 24 hours to produce slurry. The obtained slurry was converted into the form of a sheet by the doctor blade method to be cut to a given size. The sheet was degreased at 600° C. in the atmosphere, then sintered at 1500° C. for 12 hours in a 0.8-atm nitrogen atmosphere.

The same properties as those in Example 1 were measured on the completed AlN sintered body. The measured results are shown in Table 5 below, which also includes the results on the AlN sintered body of sample 5 of the invention shown in Table 2 above. This result demonstrated that the method disclosed in Tokukaihei 6-206772 substantially improves the thermal conductivity of an AlN sintered body at the cost of a considerable reduction in 3-point bending strength.

TABLE 5

| Sample | Bending strength (MPa) | Average grain diameter ($\mu$m) | Half width (deg.) | Thermal conductivity (W/mK) |
|---|---|---|---|---|
| Comparative sample | 430 | 1.5 | 0.27 | 201 |
| Sample 5 | 620 | 1.4 | 0.23 | 172 |

EXAMPLE 4

The same material powders and composition as in samples 6 and 11 in Example 1 above were used to produce slurry, from which a granular powder was formed with a spray dryer. The powder was press-formed for the final sintered body to have a size of 50×50×1.0 mm. The formed body was degreased and sintered under the same conditions as in Example 1.

The AlN sintered body was ground with a lapping machine aiming at a thickness of 0.635 mm. Each sample showed a substrate warpage of less than 10 $\mu$m at that stage. A metallized layer was formed on an individual AlN substrate with a different metallizing paste, sintering temperature, and sintering atmosphere as shown in Table 6 to evaluate the bonding strength and the substrate warpage when metallized on the whole surface.

As for the bonding strength, a metallized layer was screen-printed onto the substrate with a 2-mm square pattern and baked. An Ni-plated layer, 2 to 4 $\mu$m thick, was formed on the W- or Mo-metallized layer. An Sn-plated copper wire, 0.6 mm in diameter, was soldered onto each sample to measure the bonding strength by pulling the wire. As for the substrate warpage, a metallizing pattern having the same size as the substrate was screen-printed onto the whole surface to measure the degree of warpage after baking. The individual results on samples 6 and 11 are shown in Table 6 below.

TABLE 6

| | Metallized layer | Ag | Ag—Pd | Pt—Pd | $RuO_2$ | W | Mo |
|---|---|---|---|---|---|---|---|
| | Sintering temperature (° C.) | 850 | 850 | 950 | 680 | 1650 | 1650 |
| | Sintering atmosphere | The air | The air | The air | The air | $N_2$ gas | $N_2$ gas |
| Sample 6 | Bonding strength (kg) | 2.8 | 3.4 | 3.1 | 2.9 | 4.8 | 4.3 |
| | Warp ($\mu$m) | 25 | 30 | 37 | 18 | 17 | 36 |
| Sample 11* | Bonding strength (kg) | 2.9 | 3.2 | 3.0 | 3.2 | 4.5 | 4.1 |
| | Warp ($\mu$m) | 42 | 56 | 71 | 35 | 48 | 74 |

*Comparative sample

This result demonstrated that warpage can be reduced in the substrate having a metallized layer on the AlN sintered body of the invention as compared with ordinary substrates that do not use an AlN powder obtained by chemical vapor deposition as the material powder, without reducing the bonding strength.

Other samples having a W- or Mo-metallized layer on the whole surface of the substrate were plated with Ni 4 to 6 $\mu$m in thickness, then with Au 1 to 2 $\mu$m in thickness. Observation of the appearance of both samples under a microscope of 40 magnification confirmed the formation of satisfactory layers of plating without swelling or stain. Samples having a piece of solder on the Au-plated layer were placed in a furnace at 350° C. in a hydrogen atmosphere to observe the flowing conditions of the solder. The result was satisfactory in that the solder flowed with sufficient wettability on both samples, demonstrating the capability of the substrate to mount chips.

EXAMPLE 5

As with Example 4 above, samples 6 and 11 were used to produce slurry, from which green sheets were formed by the doctor blade method. The thickness of the sheets was adjusted for the final sintered bodies to have a thickness of 0.635 mm. Samples of a 62-mm square were cut from the sheets. A W- or Mo-paste with a 2.5 mm square pattern (considering the contraction after the sintering) was printed onto the sample. These samples were degreased and sintered under the same conditions as in Example 1. The metallized substrates thus obtained were subjected to the measurement of bonding strength by the same means as in Example 4. The results are shown in Table 7.

TABLE 7

| Sample | Bonding strength of metallized layer (kg) | |
|---|---|---|
| | W layer | Mo layer |
| 6 | 5.4 | 4.5 |
| 11* | 5.0 | 4.6 |

*Comparative sample

A W- or Mo-paste was printed onto the whole surface of other green sheets of sample 6 formed by the same method as above. The samples were degreased and sintered under the same conditions as in Example 1, then plated with Ni and Au as with Example 4 to evaluate the appearance and the solder-flowing conditions. The result was satisfactory in that both paste materials yielded good appearance and sufficient solder flowing.

The above-mentioned result and Table 7 demonstrate that for producing an aluminum-nitride sintered body according to the invention, both the sintering of a green sheet therefor and the bake-forming of a metallized layer thereon can be carried out at the same time.

EXAMPLE 6

AlN sintered bodies of samples 6 and 11 obtained in Example 4 above were ground to become substrates with a mirror finish having a thickness of 0.635 mm, the same thickness as in Example 4. Onto the AlN substrates, Ti, Pt, and Au were laminated as thin-film patterns in the order named, each pattern consisting of 40 fine lines, having a line width of 30 $\mu$m, a length of 40 mm, and a pitch of 1 mm.

Whereas the thin-film pattern formed onto the AlN sintered body of sample 6 showed no broken line, the pattern on sample 11 showed discontinuity in 2 lines. Observation of the faulty points under a scanning electron microscope (SEM) revealed that shedding of AlN grains from the substrate at the lines caused the discontinuity.

EXAMPLE 7

An AlN sintered body of sample 6 obtained in Example 4 above was ground to make a substrate with mirror finish as in Example 6. Onto the whole surface of the AlN substrate, Ti, Pt, and Au were laminated as thin films in the order named, and an Au—Sn film was formed on the top surface of the laminated films. Sufficient bonding was obtained when an IC chip of a 5-mm square was mounted onto the Au—Sn film.

What is claimed is:

1. An aluminum-nitride sintered body having:
    an average grain diameter of 2 $\mu$m or less; and
    a half width of the diffraction peak on the (302) plane, obtained by X-ray diffraction, of 0.24 deg. or less.
2. The aluminum-nitride sintered body as defined in claim 1, the sintered body having a 3-point bending strength of 450 MPa or more.
3. A method for fabricating an aluminum-nitride sintered body, comprising the steps of:
    preparing a material powder by mixing a 1 to 95 wt. % aluminum-nitride powder obtained by chemical vapor deposition and having an average particle diameter of 1.0 $\mu$m or less, with another type or types of aluminum-nitride powders constituting the remaining part;
    adding a sintering-agent powder to the material powder to form mixed powders into a shaped body; and
    sintering the shaped body in a non-oxidizing atmosphere.
4. An aluminum-nitride substrate for semiconductors, said substrate comprising an aluminum-nitride sintered body and a metallized layer formed thereon, said sintered body having an average grain diameter of 2 $\mu$m or less and a half width of the diffraction peak on the (302) plane, obtained by X-ray diffraction, of 0.24 deg. or less.
5. The aluminum-nitride substrate for semiconductors as defined in claim 4, wherein the metallized layer comprises at least one element selected from the group consisting of W, Mo, Ag, Pd, Pt, Ru, Ti, Au, and Sn.
6. The aluminum-nitride substrate for semiconductors as defined in claim 5, wherein a plated layer is formed on the metallized layer.

* * * * *